(12) United States Patent
Funk et al.

(10) Patent No.: US 6,486,665 B1
(45) Date of Patent: Nov. 26, 2002

(54) MAGNETIC FIELD SENSOR HAVING DEFORMABLE CONDUCTOR LOOP SEGMENT

(75) Inventors: Karsten Funk; Wilhelm Frey, both of Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/623,670

(22) PCT Filed: Dec. 21, 1998

(86) PCT No.: PCT/DE98/03748

§ 371 (c)(1),
(2), (4) Date: Nov. 21, 2000

(87) PCT Pub. No.: WO99/45406

PCT Pub. Date: Sep. 10, 1999

(30) Foreign Application Priority Data

Mar. 6, 1998 (DE) .......................................... 198 09 742

(51) Int. Cl.[7] ........................... G01N 27/72; H01F 5/00; H01F 21/04; H02N 1/00
(52) U.S. Cl. .................. 324/260; 324/207.15; 324/239; 310/309; 336/20
(58) Field of Search ................................. 324/239, 179, 324/207.11, 207.15, 207.17, 750, 260; 333/197; 310/309; 336/20

(56) References Cited

U.S. PATENT DOCUMENTS 3,731,184 A * 5/1973 Goldberg et al. ........... 324/239
5,640,133 A * 6/1997 MacDonald et al. ........ 333/197

FOREIGN PATENT DOCUMENTS

DE 3512180 1/1986
FR 998 040 1/1952

OTHER PUBLICATIONS

Nakane H. et al., "Micromechanical resonant magnetic sensor in standard CMOS," Institute of Electrical Engineers, Stevenage, GB, Jun., 1997, pp. 405–408.

* cited by examiner

Primary Examiner—N. Le
Assistant Examiner—Anjan K. Deb
(74) Attorney, Agent, or Firm—Kenyon & Kenyon

(57) ABSTRACT

A magnetic field sensor that can be manufactured using the technology of surface micromechanics, having a conductor loop that has at least one deformable segment; a deformation device for deforming the deformable segment of the conductor loop with a predeterminable time dependence; a voltage sensing device for sensing the voltage induced at the ends of the conductor loop upon deformation in the presence of a magnetic field; and a magnetic field determining device for determining the present static and/or dynamic magnetic field in consideration of at least the time dependence of the deformation.

14 Claims, 4 Drawing Sheets

MAGNETIC FIELD SENSOR HAVING DEFORMABLE CONDUCTOR LOOP SEGMENT

FIELD OF THE INVENTION

The present invention concerns a magnetic field sensor, and in particular a magnetic field sensor that can be manufactured using the technology of surface micromechanics.

BACKGROUND INFORMATION

Although applicable to any magnetic field sensor, the present invention and the problem on which it is based are explained with reference to a magnetic field sensor that can be manufactured using the technology surface micromechanics, for use in automotive engineering.

Magnetic field sensors can be used in many ways in automotive engineering, for example in antilock braking systems (ABS) or in automatic slip control (ASR) systems as wheel sensors, as position sensors for needle valves or ignition pulse generators, as steering wheel angle transducers, as crankshaft position transducers, etc. The demands placed on these magnetic field sensors in terms of mechanical strength, e.g. shock resistance and temperature resistance, are usually very high.

There exist in the related art a large number of known magnetic field sensors which utilize the applied force of a magnetic field on a conductor through which a current is passing. The best known example thereof is the Hall sensor.

Disadvantages that have emerged with the aforesaid known approaches are that they cannot withstand the severe mechanical and/or thermal stresses, and/or have too little sensitivity, and/or are very costly.

SUMMARY OF THE INVENTION

The magnetic field sensor according to the present invention has the advantage, as compared to known approaches to the problem, that it can be designed in such a way that it withstands severe mechanical stresses and exhibits high sensitivity simultaneously with low temperature dependence.

The underlying idea behind the present invention is that a conductor loop whose area is modulated, i.e. that has a definable time dependence, remains at a voltage as long as a magnetic field is not passing through it. As soon as this conductor loop is exposed to a magnetic field, however, the result of the area modulation is that the magnetic flux Φ continually changes, causing a voltage induction that is proportional to the magnetic flux density and to the change in area over time. This voltage is picked off at the ends of the conductor loop and is analyzed in accordance with the mechanical excitation. The magnetic field sensor according to the present invention can be used to sense both constant magnetic fields and alternating magnetic fields, up to a system-related limit frequency.

According to a preferred development, in the undeformed state the conductor loop encloses an area having two longitudinal sides substantially parallel to one another, and the deformation device deforms the two longitudinal sides to change the enclosed area. It is thus advantageously possible to achieve a large change in area.

According to a further preferred development, the deformation device is configured such that it excites the two longitudinal sides to opposite-direction resonant flexural oscillations. It is thus advantageously possible to achieve a particularly large change in area utilizing resonance exaggeration.

According to a further preferred development, the conductor loop is configured such that the opposite-direction resonant flexural oscillations have a different resonant frequency from the corresponding same-direction resonant flexural oscillations. It is thereby advantageously possible to avoid interferences with the undesired same-direction resonant flexural oscillations, in which the net change in area is substantially zero.

According to a further preferred development, the deformation device is configured such that it deforms the deformable segments by way of a capacitive coupling. As a result, neither friction losses nor wear occur during excitation. In addition, capacitive excitation devices of this kind are known from other sectors, for example comb structures of acceleration sensors.

According to a further preferred development, the magnetic field sensor is manufactured using the technology of surface micromechanics, and has a substrate that is preferably made of silicon (or of another electrically conductive material). The conductor loop has substantially a rectangular shape, whose longitudinal sides are arranged floatingly above the substrate and are deformable by the deformation device, and whose widthwise sides are mounted floatingly on the substrate. This particular embodiment by high sensitivity simultaneously with low temperature dependence.

According to a further preferred development, the conductor loop has a continuous, nondeformable first widthwise side having a greater thickness than the longitudinal sides, which is connected, via at least one deformable floating strut having substantially the thickness of the longitudinal sides, to at least one connector pad anchored in the substrate. This rigid first widthwise side stabilizes the width of the surface.

According to a further preferred development, the conductor loop has a split nondeformable second widthwise side having a greater thickness than the longitudinal sides, whose parts is connected via a respective deformnable floating strut, having substantially the thickness of the longitudinal sides, to a respective connector pad anchored in the substrate. This split rigid second widthwise side also stabilizes the width of the surface, and allows the induced voltage to be picked off advantageously.

According to a further preferred development, the longitudinal sides are connected at their first end, via a deformable floating first resilient strut having substantially the thickness of the longitudinal sides, to a connector pad anchored in the substrate. With this embodiment, the split rigid second widthwise side is advantageously omitted, so that the structure becomes simpler.

According to a further preferred development, the longitudinal sides are connected at their second end, via a deformable floating second resilient strut having substantially the thickness of the longitudinal sides, to the continuous nondeformable first widthwise side.

According to a further preferred development, an additional mass is provided floatingly above the substrate in the middle of the deformable longitudinal sides. This additional mass is advantageously used to adjust the resonant frequency.

According to a further preferred development, a comb drive device connected to the longitudinal sides is provided as the deformation device. This connection can be either direct, by the fact that comb teeth are provided on the longitudinal sides; or indirect, by the fact that comb teeth are provided on an additional mass that is possibly present.

Figure 1:
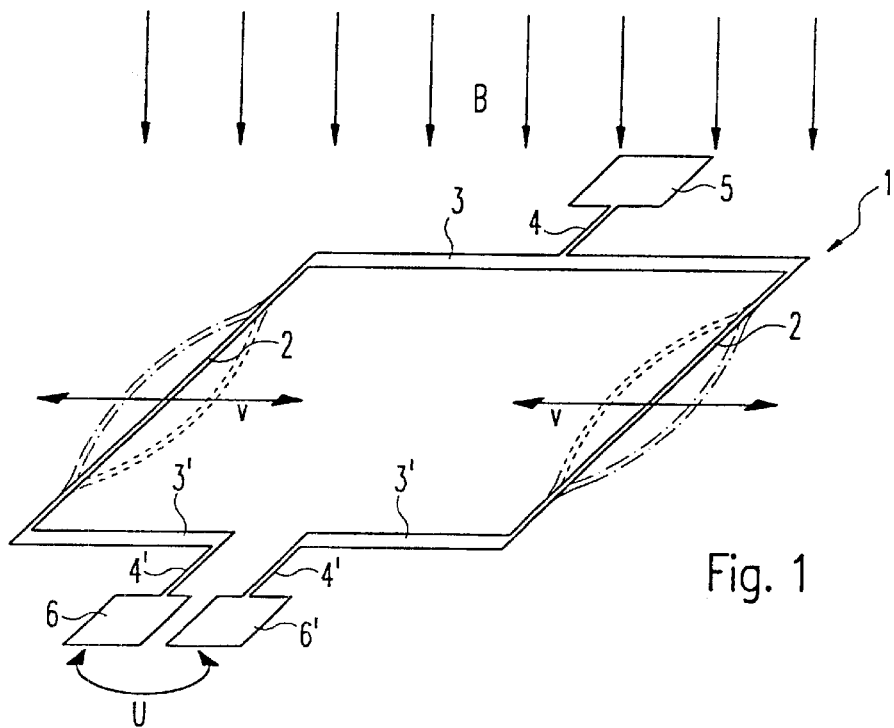
FIG. 1 shows a schematic depiction to explain the measurement principle of the magnetic field sensor according to the present invention.

DETAILED DESCRIPTION
Description of Exemplary Embodiments

In the Figures, identical reference characters refer to identical or functionally identical components.

FIG. 1 is a schematic depiction to explain the measurement principle of the magnetic field sensor according to the present invention.

In FIG. 1, 1 designates in general a conductor loop of substantially rectangular shape, 2 deformable longitudinal sides of conductor loop 1, 3 and 3' nondeformable widthwise sides of conductor loop 1, 4 and 4' deformable struts, and 5 and 6, 6' connector pads. B designates an external magnetic field, U an induced voltage, and v the movement direction or deformation direction of longitudinal sides 2.

The measurement principle of the magnetic field sensor according to the present invention is simply that a suitable mechanical excitation creates an oscillating change in area dA/dt in area A of conductor loop 1, which in the presence of a magnetic field B generates an induced voltage U at connector pads 6, 6'. The modulation function of area A, for example $A = A_0 \cos \omega t$, is utilized for demodulation of the correspondingly modulated induced voltage U, from which results a voltage which is proportional to the magnetic flux density B and whose sign indicates the direction of the magnetic field lines. Absolute values can be determined by suitable calibration or by the exact geometry of the arrangement.

The following special feature applies to an external magnetic field. If the condition $\Phi = B \cdot A$ is set for the magnetic flux—where $A = A_0 \cos \omega t$ and $B = B_0 \cos \Omega t$, $\omega$ being the angular velocity of the change in area and $\Omega$ the angular velocity of the change in magnetic field—the following is obtained for the induced voltage U:

$$U = -d\Phi/dt = -d/dt(A_0 \cos \omega t \times B_0 \cos \Omega t)$$

The measured signal is then therefore an amplitude-modulated signal with a suppressed carrier. Only two sidebands appear in the frequency spectrum, at distances of $+/-\Omega$ from the carrier $\omega$. Using demodulation methods that are very familiar from general communications technology—for example, multiplication by the carrier frequency $\omega$ followed by lowpass filtering—it is easy to draw conclusions as to the amplitude and direction, and the angular velocity $\Omega$, of the change in magnetic field.

Figure 2:
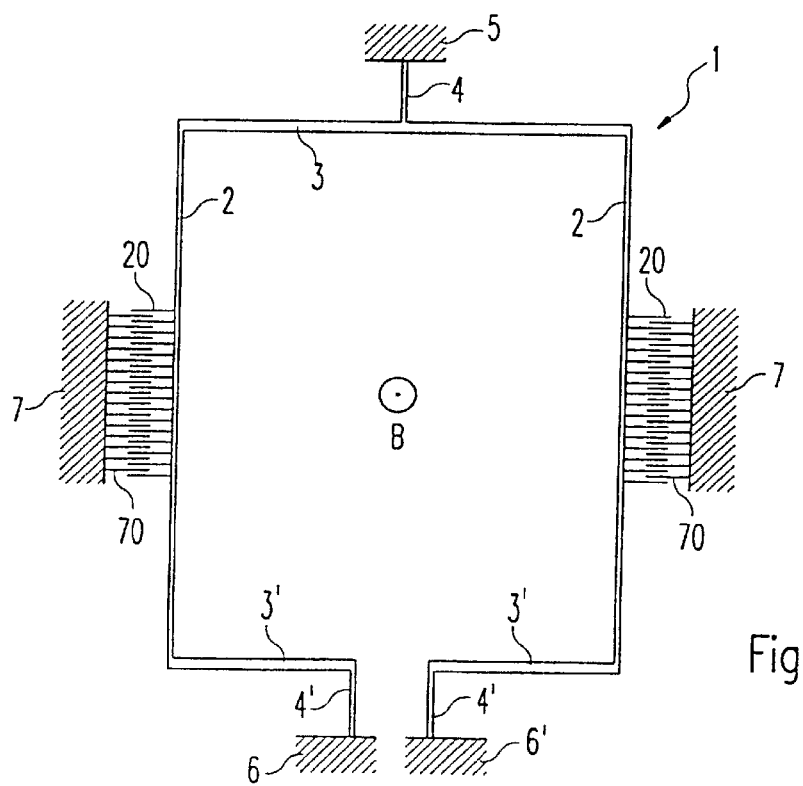
FIG. 2 shows a schematic depiction of a first embodiment of the magnetic field sensor according to the present invention.

FIG. 2 is a schematic depiction of a first embodiment of the magnetic field sensor according to the present invention.

In FIG. 2, in addition to the reference characters already introduced, 20 designates a comb structure provided on longitudinal sides 2, and 70 a comb structure that is provided in an anchoring element 7 and engages into comb structure 20.

This first embodiment, like all the other embodiments described here, is manufactured using the technology of surface micromechanics, specifically with a silicon substrate.

Conductor loop 1, which is substantially rectangular in shape, has its longitudinal sides 2 as thin bars, and its widthwise sides 3, 3' as thicker bars, arranged floatingly over the substrate. The continuous, thick (i.e. nondeformable) first widthwise side 3 is connected via the thin (i.e. deformable) floatinq strut 4 to connector pad 5 anchored in the substrate. The split, thick (i.e. nondeformable) second widthwise side 3' is connected via a respective thin (i.e. deformable) floating strut 4' to the respective corresponding connector pad 6, 6' anchored in the substrate.

Comb devices 20, 70 are also provided floatingly above the substrate, anchoring element 7 being anchored in the substrate.

The resilient attachment of conductor loop 1 to the substrate by way of the thin struts 4, 4' makes it possible to achieve a mode separation between a same-direction movement of the bendable longitudinal sides 2 in which both are deflected in the same direction, and an opposite-direction movement in which the two are deflected in opposite directions. This mode separation is based on the fact that in the same-direction movement, struts 4, 4' and widthwise sides 3, 3' co-oscillate to some extent, whereas in the opposite-direction movement these components remain stationary. The mechanical resonant frequency of the system will thus be lower for the same-direction movement than for the opposite-direction movement.

Excitation of conductor loop 1 is achieved via comb structures 20, 70 which are known from acceleration sensor drives and comb drives. Electrostatic attractive forces are generated by way of a preferably sinusoidal voltage, causing comb structure 20 to be pulled into or forced out of comb structure 70. The mechanical deflection of longitudinal sides 2 can be measured by way of the same comb structure or an additional one of similar configuration; based on these measurement results, the mechanical excitation can be kept constant in terms of its frequency and amplitude. For accurate measurement, it is important that these mechanical parameters be kept constant. Suitable control circuits that serve this purpose are widely known in the existing art. Advantageously a resonant excitation is performed, since then on the one hand the aforesaid mode selection is possible, and on the other hand the mechanical quality exaggeration can be utilized, resulting in a reduction in the electrical excitation amplitude. In order to reduce damping as much as possible, the magnetic field sensor can also be operated in vacuum.

Figure 3:
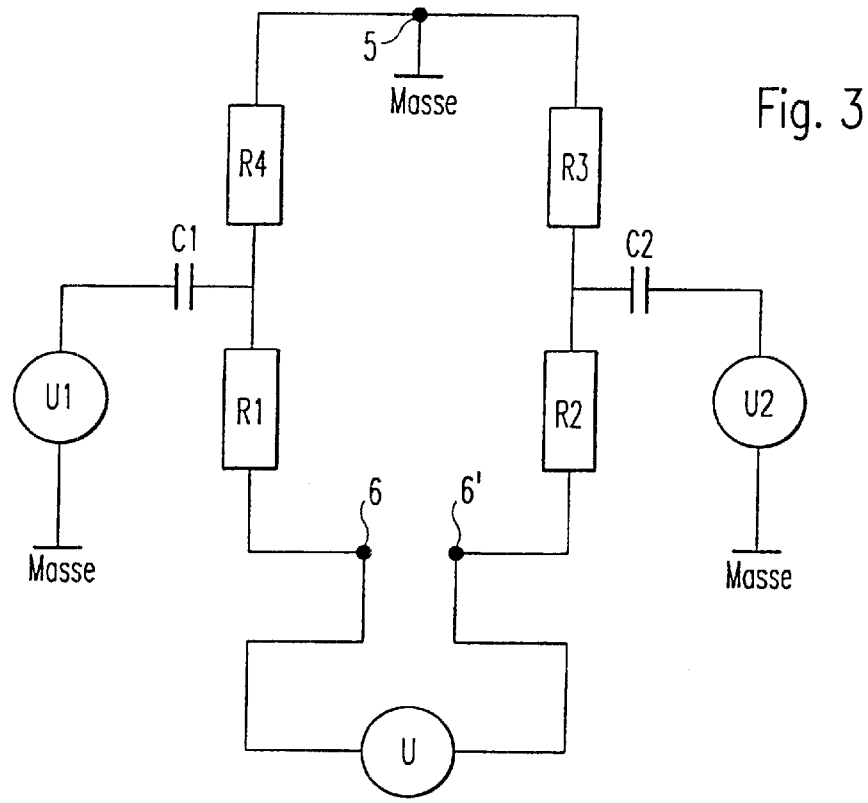
FIG. 3 shows a circuit diagram of the first embodiment of the magnetic field sensor according to the present invention.

FIG. 3 is a circuit diagram of the first embodiment of the magnetic field sensor according to the present invention.

In FIG. 3, in addition to the reference characters already introduced, U1 and U2 designate the excitation voltages of comb device 70, C1 and C2 the capacitive coupling between comb devices 20 and 70, R1 through R4 equivalent resistances of the corresponding conductor loop segments, and MASSE the zero or ground potential.

When longitudinal sides are at rest, there is applied to conductor stop 1 a voltage U that is proportional to the change dB/dt in magnetic field B. This corresponds to the trivial formulation according to which known induction measuring instruments operate. If the conductor loop is driven electrostatically with voltages U1 and U2 via comb structures 20, 70, then the equivalent circuit diagram shown in FIG. 3 applies.

An important point to be noted in this context is the following: If a sinusoidal alternating current is applied to comb structures 20, 70 in order to excite conductor loop 1, then a sinusoidal alternating current also flows through resistances R3 and R4, generating a corresponding voltage drop which falsifies the measurement signal of the induced voltage U.

The actions set forth below can be taken to counteract this falsification.

First, a minimization can be accomplished by generating a common-mode signal. Since a differential signal is measured at the output of conductor loop 1 (connector pads 6, 6'), the influence can be minimized by also generating a similar voltage drop. For that purpose, U1 is set equal to U2. Assuming C1=C2 and R3=R4, this results in identical voltage drops which cancel one another out when the differential voltage is measured at the output of conductor loop 1.

Second, a phase discrimination in the context of resonant excitation can be performed. The current i through capacitive structure C1, C2 has a cosine profile if the excitation voltage is sinusoidal, since i=C dU/dt for capacitors C1, C2. If comb structure 20, 70 is excited with a sinusoidal voltage, then the electrostatic force relevant for drive purposes also has a component with the time function $F_0 \sin \omega t$. With resonant excitation, the movement amplitude lags this force with a 90° offset, i.e. with a time dependence $\cos \Omega t$, like the interfering current. What is relevant for the voltage U induced by the magnetic field, however, is the velocity of the movement, which again occurs at a 90° offset, i.e. with a time dependence —$\sin \omega t$. The result is a phase difference of 90° between the induced voltage U and the parasitic voltages dropping through resistances R3 and R4. The interfering current can thus be filtered out by phase-sensitive demodulation.

Third, discrimination in the frequency range can be performed. As stated, the voltage U induced by a magnetic field B is proportional to the velocity of the movement, i.e. has, for example, a time dependence —$\sin \omega t$. The electrostatically generated force $F_0 \sin \omega t$ is proportional to the square of the electrical excitation voltage U1 or U2. In other words, in accordance with known trigonometric identities, the excitation frequency that generates a force profile $F_0 \sin \omega t$ equals 1/2 $\omega t$. The voltage drop across resistances R3 and R4 then also has a time dependent cos 1/2 $\omega t$. The undesired voltage drops on thus be removed by electrical high-pass filtration.

Figure 4:
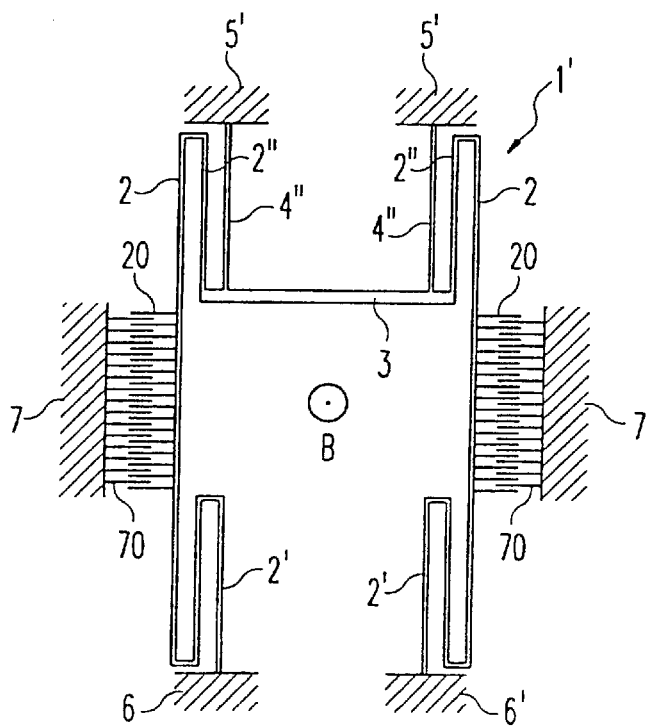
FIG. 4 shows a schematic depiction of a second embodiment of the magnetic field sensor according to the present invention.

FIG. 4 is a schematic depiction of a second embodiment of the magnetic field sensor according to the present invention.

In FIG. 4, in addition to the reference characters already introduced, 1'' designates the conductor loop according to the second embodiment, 2' and 2'' a respective thin (i.e. deformable) first and second resilient strut, and 5' two connector pads that are connected via a respective thin (i.e. deformable) strut 4'' to the wide (i.e. nondeformable) widthwise side 3.

In contrast to the aforementioned first embodiment, in the second embodiment two connector pads 5, 5' are connected to the rigid widthwise side 3 via struts 4''.

Longitudinal sides 2 are connected at their first (lower) ends, via the deformable floating first resilient struts 2 having substantially the thickness of longitudinal sides 2, to connector pads 6, 6' anchored in the substrate. In other words, in this embodiment only one upper rigid widthwise side 3 is provided.

In addition, longitudinal sides 2 are connected at their second (upper) ends, via the deformable floating second struts 2'' having substantially the thickness of longitudinal sides 2, to the continuous nondeformable first widthwise side 3.

The second embodiment is otherwise identical in function and configuration to the first embodiment.

Figure 5:
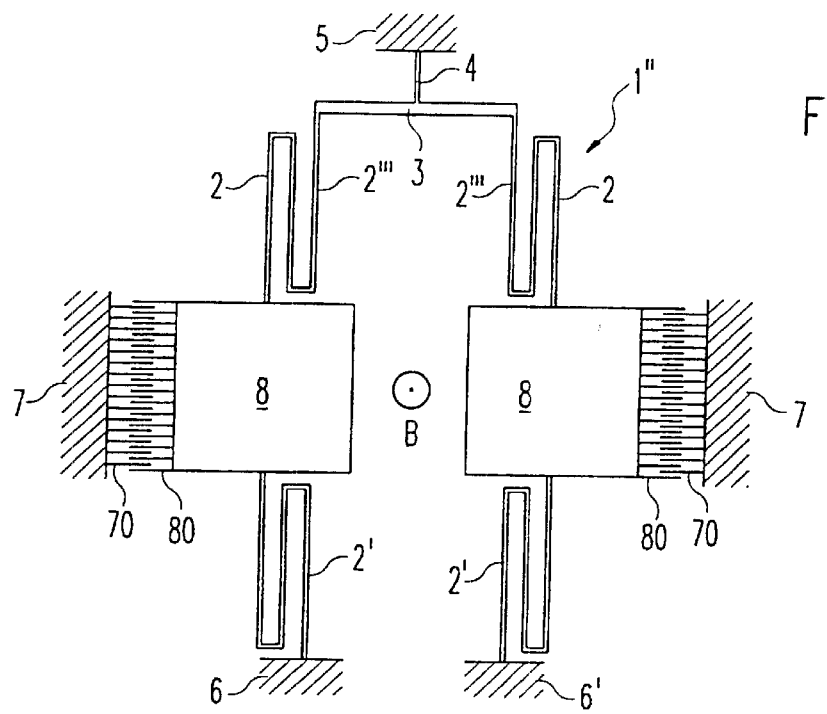
FIG. 5 shows a schematic depiction of a third embodiment of the magnetic field sensor according to the present invention.

FIG. 5 is a schematic depiction of a third embodiment of the magnetic field sensor according to the present invention.

In FIG. 5, in addition to the reference characters already introduced, 1''' designates the conductor loop according to the third embodiment, 2''' a respective thin (i.e. deformable) resilient strut, and 8 an additional mass integrated into the longitudinal sides.

In contrast to the aforementioned first and second embodiments, in the third embodiment there is provided, floatingly above the substrate in the middle of deformable longitudinal sides 2, additional mass 8 by way of which the resonant frequency of longitudinal sides 2 can be tuned. Comb structure 80 is also provided on additional mass 8 instead of comb structure 20.

In addition, the attachment of longitudinal sides 2 at their upper edge to rigid widthwise side 3 is accomplished via the odified resilient struts 2'''. Rigid widthwise side 3 is anchored only by way of one strut 4 to a connector pad 5.

The third embodiment is otherwise identical in function and configuration to the second embodiment.

Figure 6:
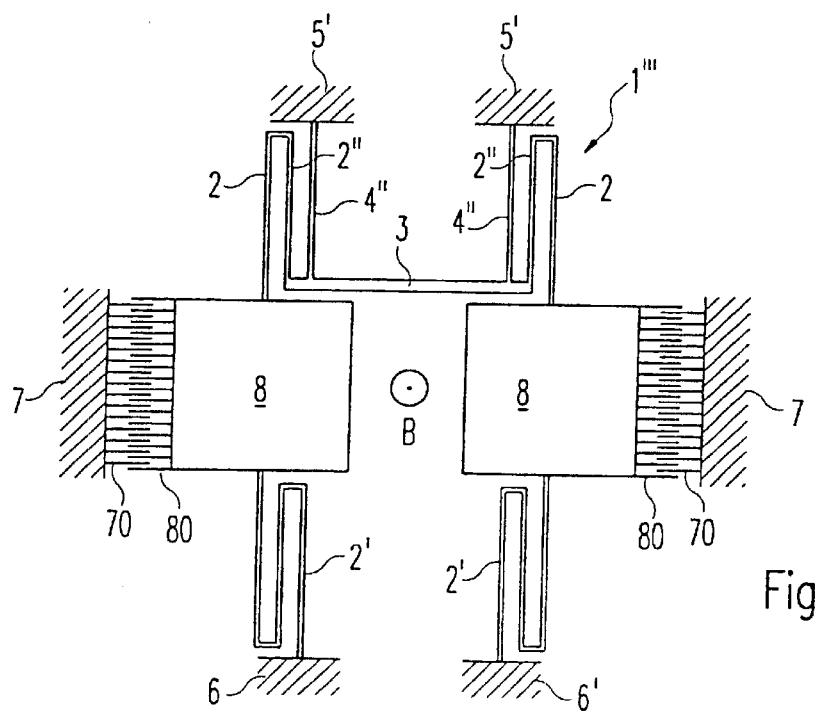
FIG. 6 shows a schematic depiction of a fourth embodiment of the magnetic field sensor according to the present invention.

FIG. 6 is a schematic depiction of a fourth embodiment of the magnetic field sensor according to the present invention.

In FIG. 6, in addition to the reference characters already introduced, 1''' designates the conductor loop according to the fourth embodiment. This fourth embodiment corresponds to the second embodiment with the addition of additional mass 8.

Figure 7:
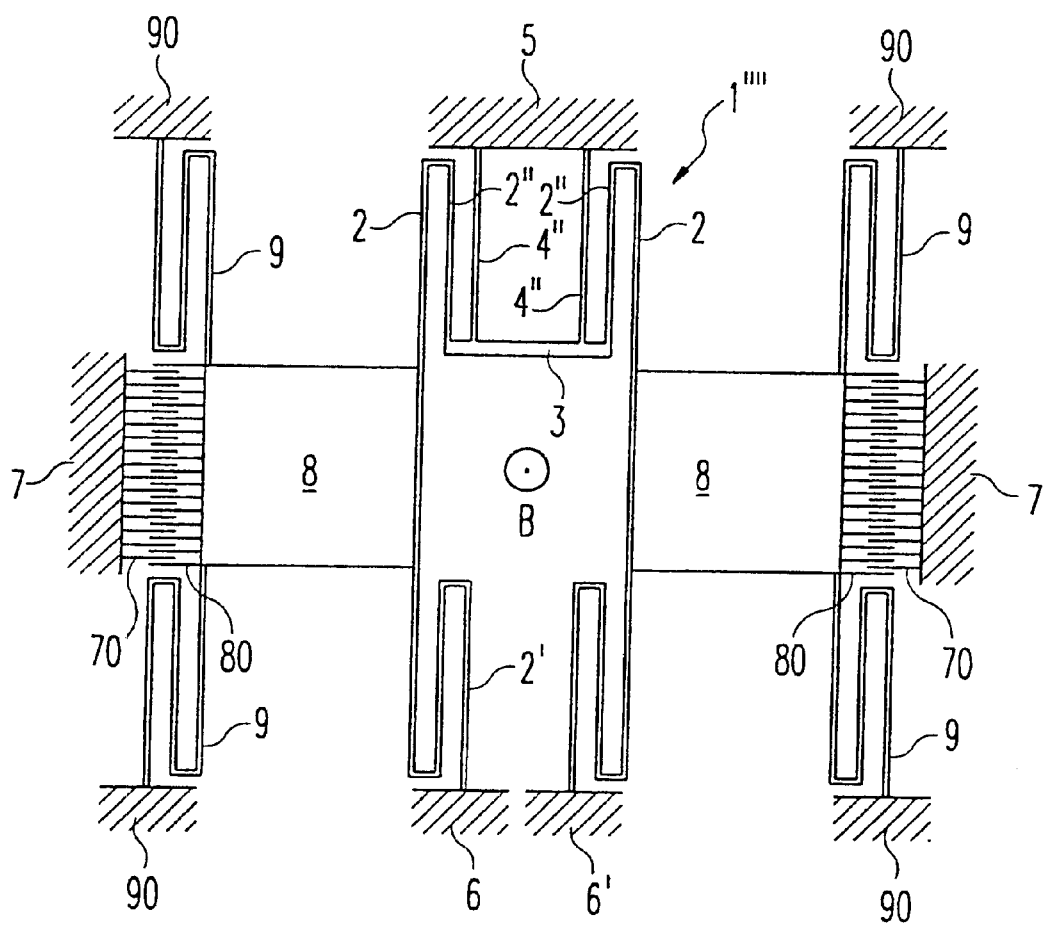
FIG. 7 shows a schematic depiction of a fifth embodiment of the magnetic field sensor according to the present invention.

FIG. 7 is a schematic, depiction of a fifth embodiment of the magnetic field sensor according to the present invention.

In FIG. 7, in addition to the reference characters already introduced, 1'''' designates the conductor loop according to the fifth embodiment, and 9 designates respective thin (i.e. deformable) connecting struts to corresponding additional anchoring elements 90 to the substrate.

This fifth embodiment corresponds to the fourth embodiment with the addition of the additional connecting struts and the additional anchoring element 90 to the substrate. These additional design features stabilize additional mass 8 with respect to interfering torques.

Although the present invention was described above with reference to preferred exemplary embodiments, it is not limited thereto but rather is modifiable in many ways.

In particular, the conductor loop can of course have a geometry that is other than rectangular.

The micromechanical base material also need not be silicon, but rather can be any desired base material.

Furthermore, excitation of the deformable segments of the conductor loops need not be accomplished capacitively, but can also be effected inductively, magnetically, or in any other manner.

Analysis of the measurement signals need not be accomplished in the time domain, but can also take place by way of corresponding Fourier transforms.

Lastly, the magnetic field sensor need not necessarily be a micromechanical component, but can also, depending on the magnetic fields to be sensed, be a macromechanical component.

LIST OF REFERENCE CHARACTERS

1, 1', 1'', 1''', 1'''' Conductor loop
2 Longitudinal sides 3, 3' Widthwise sides
4, 4', 4", 9 Struts
5, 6, 6' Connector pads
B Magnetic field
U Induced voltage
v Velocity
7, 90 Anchoring element
20, 70, 80 Comb structures
2, 2", 2'" Resilient struts
8 Additional mass
R1-R4 Equivalent resistances
C1, C2 Equivalent capacitances
U1, U2 Excitation voltages
MASSE Ground potential

What is claimed is:

1. A magnetic field sensor, comprising:
    a conductor loop including at least one deformable segment;
    a deformation device for deforming the at least one deformable segment of the conductor loop with a predeterminable time dependence;
    a voltage sensing device for sensing a voltage induced at ends of the conductor loop upon deformation in a presence of a magnetic field; and
    a magnetic field determining device for determining the magnetic field when the magnetic field is in at least one of a present static state and a present dynamic state in consideration of at least the time dependence of the deformation, wherein:
        the deformation device deforms the at least one deformable segment by generating electrostatic attractive forces via a capacitive coupling.

2. The magnetic field sensor according to claim wherein:
    the magnetic field sensor is manufactured using a surface micromechanics technology.

3. The magnetic field sensor according to claim 1 wherein:
    in an undeformed state the conductor loop encloses an area bounded by two longitudinal sides of the conductor loop that are substantially parallel to one another, and
    the deformation device deforms the two longitudinal sides to change the enclosed area.

4. The magnetic field sensor according to claim 3, wherein:
    the deformation device excites the two longitudinal sides to opposite-direction resonant flexural oscillations.

5. The magnetic field sensor according to claim 4, herein:
    the conductor loop is configured such that the opposite-direction resonant flexural oscillations have a different resonant frequency from corresponding same-direction resonant flexural oscillations.

6. The magnetic field sensor according to claim 3, further comprising:
    a substrate above which are floatingly arranged the two longitudinal sides of the conductor loop and on which are floatingly mounted widthwise sides of the conductor loop, wherein:
        the conductor loop has a substantially rectangular shape, and
        the two longitudinal sides are deformable by the deformation device.

7. The magnetic field sensor according to claim 6, wherein:
    the substrate includes silicon.

8. The magnetic field sensor according to claim 6, further comprising:
    at least one connector pad anchored in the substrate; and
    at least one deformable floating strut having a thickness that substantially corresponds to a thickness of the two longitudinal sides and via which a continuous, nondeformable one of the widthwise sides is connected to the at least one connector pad, wherein:
        the continuous, nondeformable widthwise side has a greater thickness than that of the two longitudinal sides.

9. The magnetic field sensor according to claim 8, wherein:
    another one of the widthwise sides corresponds to a split, nondeformable second widthwise side having a greater thickness than that of the two longitudinal sides and having parts each connected via a respective one of the at least one deformable floating strut to a respective one of the at least one connector pad.

10. The magnetic field sensor according to claim 8, further comprising:
    a deformable floating first resilient strut, wherein:
        a first end of respective ones of the two longitudinal sides are each connected via the deformable floating first resilient strut to the at least one connector pad, and
        the deformable floating first resilient strut has a thickness that is substantially that of the two longitudinal sides.

11. The magnetic field sensor according to claim 8, further comprising:
    a deformable floating second resilient strut, wherein:
        a second end of respective ones of the two longitudinal sides are each connected via the deformable floating second resilient strut to the continuous, nondeformable widthwise side, and
        the deformable floating second resilient strut has a thickness that is substantially that of the two longitudinal sides.

12. The magnetic field sensor according to claim 6, further comprising:
    an additional mass provided floatingly above the substrate in a middle of the two longitudinal sides.

13. The magnetic field sensor according to claim 6, wherein:
    the deformation device includes a comb drive device connected to the two longitudinal sides.

14. The magnetic field sensor according to claim 1, wherein:
    the conductor loop includes at least one non-deformable segment.

* * * * *